(12) United States Patent
Murakami

(10) Patent No.: US 11,322,365 B2
(45) Date of Patent: May 3, 2022

(54) SUBSTRATE PROCESSING METHOD AND SUBSTRATE PROCESSING APPARATUS

(71) Applicant: Tokyo Electron Limited, Tokyo (JP)

(72) Inventor: Hiroki Murakami, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 3 days.

(21) Appl. No.: 17/029,300

(22) Filed: Sep. 23, 2020

(65) Prior Publication Data
US 2021/0098267 A1 Apr. 1, 2021

(30) Foreign Application Priority Data

Sep. 30, 2019 (JP) .............................. JP2019-180826

(51) Int. Cl.
*H01L 21/321* (2006.01)
*H01L 21/3213* (2006.01)
*H01L 21/67* (2006.01)

(52) U.S. Cl.
CPC .. *H01L 21/32136* (2013.01); *H01L 21/67069* (2013.01)

(58) Field of Classification Search
None
See application file for complete search history.

(56) References Cited

U.S. PATENT DOCUMENTS

2012/0231561 A1\* 9/2012 Dolan ............... H01L 21/02071
438/14

FOREIGN PATENT DOCUMENTS

JP 2001-284317 A 10/2001

\* cited by examiner

*Primary Examiner* — Roberts P Culbert
(74) *Attorney, Agent, or Firm* — Nath, Goldberg & Meyer; Jerald L. Meyer; Tanya E. Harkins

(57) ABSTRACT

There is provided a substrate processing method including: reducing an oxide of a ruthenium film by supplying a hydrogen-containing gas to a substrate including the ruthenium film; etching the ruthenium film by supplying an oxygen-containing gas to the substrate so as to oxidize the ruthenium film; and repeating, multiple times, a cycle including reducing the oxide of the ruthenium film and etching the ruthenium film.

6 Claims, 8 Drawing Sheets

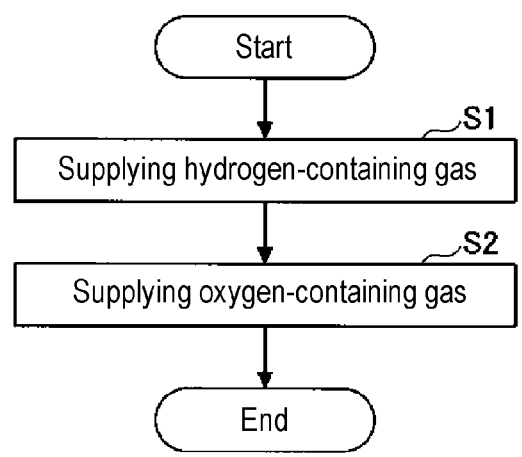

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-180826, filed on Sep. 30, 2019, the entire contents of which are incorporated herein by reference.

TECHNICAL FIELD

The present disclosure relates to a substrate processing method and a substrate processing apparatus.

BACKGROUND

Patent Document 1 discloses that ruthenium (Ru) is etched by causing Ru to react with a gas of ozone or oxygen atoms to generate $RuO_4$ having a high vapor pressure. Further, Patent Document 1 discloses that a minute amount of a halogen gas or a hydrogen halide gas is added to the gas of ozone or oxygen atoms to cause a halogenation reaction of Ru, thereby suppressing the production of $RuO_2$. In addition, Patent Document 1 discloses that by adding a reducing gas to the gas of ozone or oxygen atoms, $RuO_2$ is reduced to Ru.

PRIOR ART DOCUMENT

Patent Document

Patent Document 1: Japanese Laid-Open Patent Publication No. 2001-284317

SUMMARY

According to one embodiment of the present disclosure, there is provided a substrate processing method including: reducing an oxide of a ruthenium film by supplying a hydrogen-containing gas to a substrate including the ruthenium film; etching the ruthenium film by supplying an oxygen-containing gas to the substrate so as to oxidize the ruthenium film; and repeating, multiple times, a cycle including reducing the oxide of the ruthenium film and etching the ruthenium film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating a substrate processing method according to a reference embodiment.

DETAILED DESCRIPTION

Figure 2A:
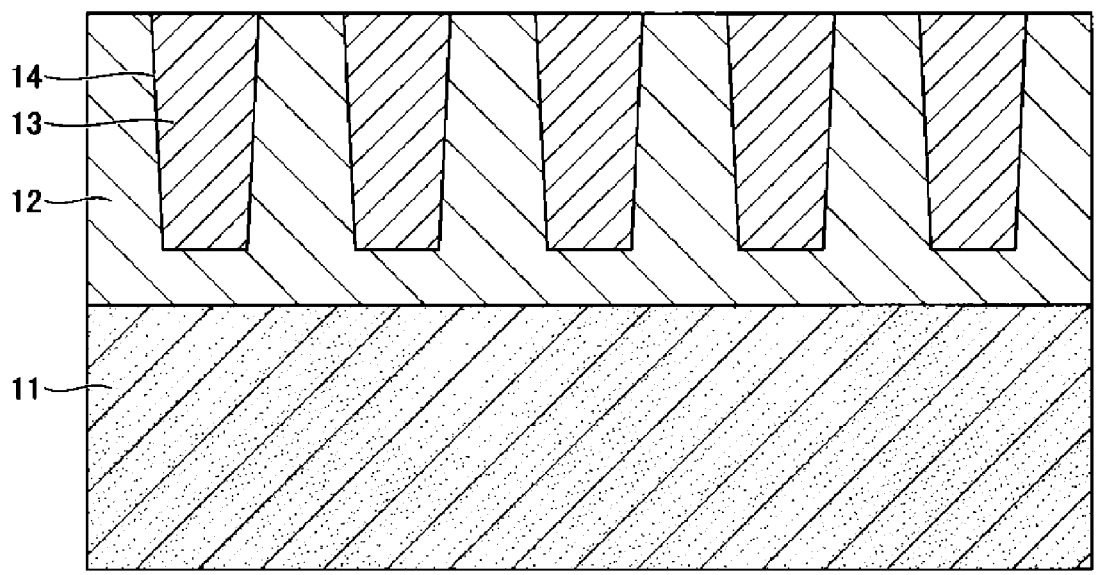
FIG. 2A is a cross-sectional view illustrating an example of a substrate before being processed by the substrate processing method of FIG. 1.

Hereinafter, embodiments of the present disclosure will be described with reference to the drawings. In addition, in each drawing, the same or corresponding components will be denoted by the same or corresponding reference numerals, and a description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a substrate processing method according to a reference embodiment will be described with reference to FIGS. 1, 2A, and 2B. As illustrated in FIG. 1, the substrate processing method includes supplying a hydrogen-containing gas (step S1) and supplying an oxygen-containing gas (step S2).

The substrate processing method processes a substrate 10 illustrated in FIG. 2A. The substrate 10 has, for example, a base substrate 11, an insulation film 12, and a ruthenium film 13. The base substrate 11 is a semiconductor substrate such as a silicon substrate or a compound semiconductor substrate. In addition, the base substrate 11 may be, for example, a glass substrate.

The insulation film 12 is formed on the surface of the base substrate 11. The insulation film 12 is, for example, a silicon oxide film. The silicon oxide film is, for example, a thermal oxide film obtained by heating a silicon substrate in an oxygen atmosphere.

The insulation film 12 may be formed by a known method other than the thermal oxidation method, for example, a chemical vapor deposition (CVD) method. Further, an intermediate film (not illustrated) may also be formed between the insulation film 12 and the base substrate 11.

The insulation film 12 has recesses 14 formed on the surface thereof. The recesses 14 do not penetrate the insulation film 12 in the thickness direction in FIG. 2A, but may penetrate the insulation film 12. Pattern of the recesses 14 is formed by a photolithography method, an etching method, or the like.

The ruthenium film 13 is formed on the surface of the insulation film 12 and is buried in the recesses 14. The ruthenium film 13 is formed by, for example, a CVD method.

After the ruthenium film 13 is formed, a planarization process is performed until the insulation film 12 is exposed. The planarization process is, for example, chemical mechanical polishing (CMP).

By the planarization process, the substrate 10 illustrated in FIG. 2A is obtained. The structure of the substrate 10 provided in the substrate processing method of FIG. 1 is not limited to the structure illustrated in FIG. 2A. The substrate 10 may be any substrate as long as it includes the ruthenium film 13.

In step S1 of FIG. 1, a hydrogen-containing gas is supplied to the substrate 10 illustrated in FIG. 2A so as to reduce an oxide of the ruthenium film 13. $RuO_2$ can be reduced to Ru, and thus Ru can be oxidized to $RuO_4$ in step S2 of FIG. 1.

Once $RuO_2$ is formed, the oxidation of $RuO_2$ to $RuO_4$ hardly progresses, unlike the oxidation of Ru to $RuO_4$. In addition, $RuO_2$ has a lower vapor pressure than $RuO_4$, and hardly sublimates under a reduced pressure.

Thus, $RuO_2$ is reduced to Ru in step S1 of FIG. 1, and Ru is oxidized to $RuO_4$ in step S2 of FIG. 1. $RuO_4$, which has a high vapor pressure, easily sublimates under a reduced pressure. By sublimation of $RuO_4$, etching of the ruthenium film 13 can be implemented.

The hydrogen-containing gas includes at least one selected from a group consisting of a $H_2$ gas, a $NH_3$ gas, a hydrazine gas, and a hydrazine compound gas. The hydrogen-containing gas is not particularly limited, as long as it can reduce $RuO_2$ to Ru.

The hydrogen-containing gas may be activated by heat without being plasmarized. In the present embodiment, the hydrogen-containing gas is plasmarized to lower a processing temperature of the substrate 10. The plasmarized $H_2$ gas contains H radicals, and can reduce $RuO_2$ to Ru at a low temperature of about 200 degrees C. to 300 degrees C.

A noble gas such as an Ar gas may be added to the hydrogen-containing gas. By adding the noble gas to the hydrogen-containing gas, H radicals can be maintained for a long period of time, so that the ruthenium film 13 can be uniformly reduced over a wide range of the substrate 10.

In step S2 of FIG. 1, the oxygen-containing gas is supplied to the substrate 10 to oxidize and etch the ruthenium film 13. Since Ru is oxidized to $RuO_4$ and $RuO_4$ is sublimated, etching of the ruthenium film 13 is implemented.

The oxygen-containing gas includes at least one selected from a group consisting of, for example, an $O_2$ gas and an $O_3$ gas. The oxygen-containing gas is not particularly limited as long as it can oxidize Ru into $RuO_4$.

The oxygen-containing gas may be activated by heat without being plasmarized. In the present embodiment, the oxygen-containing gas is plasmarized to lower the processing temperature of the substrate 10. The plasmarized $O_2$ gas contains O radicals, and can oxidize Ru to $RuO_4$ at a low temperature of about 200 degrees C. to 300 degrees C.

Figure 2B:
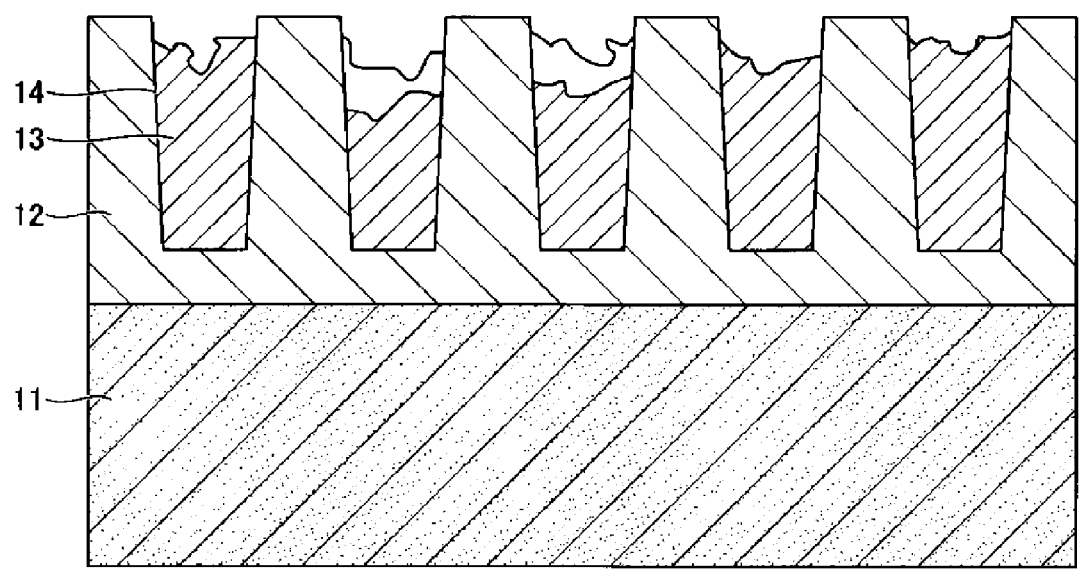
FIG. 2B is a cross-sectional view illustrating an example of a substrate after being processed by the substrate processing method of FIG. 1.

As illustrated in FIG. 2B, according to the substrate processing method illustrated in FIG. 1, the etched amount is small. This is because since step S1 and step S2 are performed only once, if $RuO_2$ is generated during step S2, the progress of etching stops from that point in time.

Further, as illustrated in FIG. 2B, according to the substrate processing method illustrated in FIG. 1, the surface of the ruthenium film 13 becomes rough, and thus the height difference of surface irregularities is large. The height difference is recognized not only in the width direction of the recesses 14 (the left-right direction on the paper in FIG. 2B), but also in the direction orthogonal to the width direction and the depth direction of the recesses 14 (the direction orthogonal to the paper in FIG. 2B).

The large height difference is caused because the ruthenium film 13 is a polycrystalline film. This is because, for example, crystal grain boundaries on the surface of the ruthenium film 13 are selectively etched. In addition, the crystal orientation of the surface of the ruthenium film 13 is different for each crystal grain. Thus, the ease of progress of oxidation, and further the ease of progress of sublimation are different for each crystal grain.

As described above, when steps S1 and S2 are performed once, $RuO_2$ is generated during step S2, and thus the progress of etching may be stopped. Further, uneven etching occurs due to the influence of the polycrystalline film, and thus, the height difference of the surface irregularities may become large.

Figure 3:
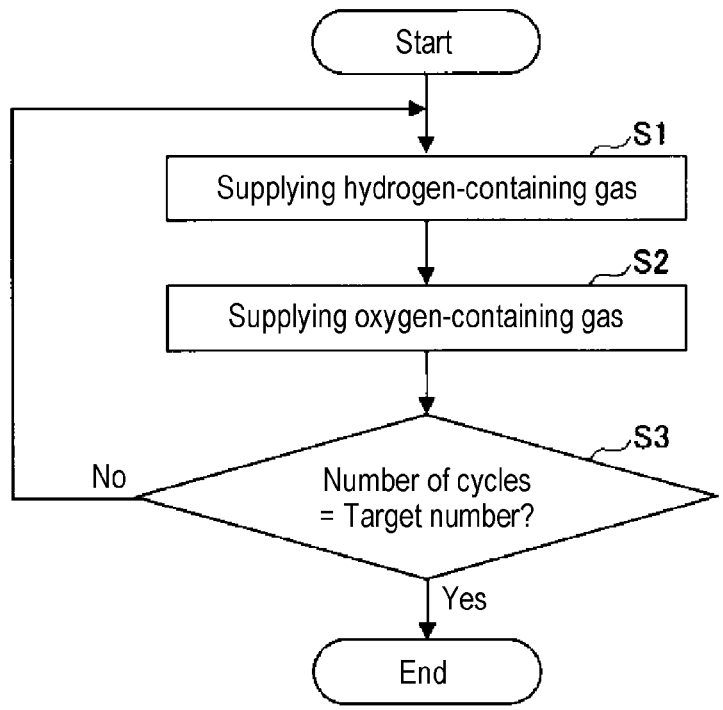
FIG. 3 is a flowchart illustrating a substrate processing method according to an embodiment.
Figure 4:
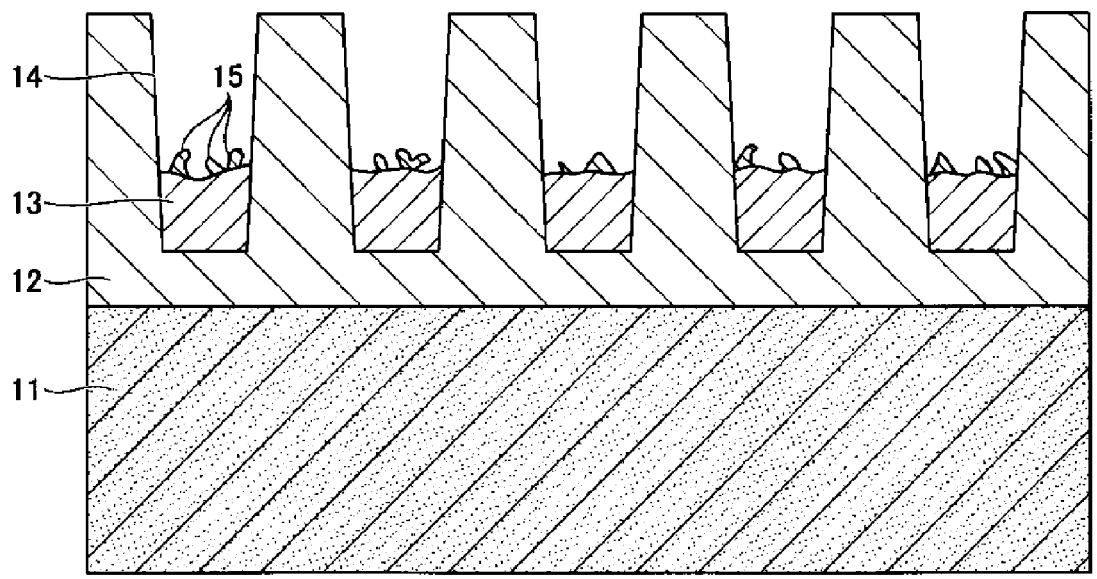
FIG. 4 is a cross-sectional view illustrating an example of a substrate after being processed by the substrate processing method of FIG. 3.

Next, a substrate processing method according to an embodiment will be described with reference to FIGS. 3 and 4. Hereinafter, differences from the above-described reference embodiment will be mainly described. As illustrated in FIG. 3, the substrate processing method includes repeating a cycle including an act of supplying the hydrogen-containing gas (step S1) and an act of supplying the oxygen-containing gas (step S2), multiple times. In FIG. 3, a target number of times is multiple times.

Since the cycle is repeated multiple times, for example, $RuO_2$ generated in the Nth (N is a natural number of 1 or more) round of step S2 is reduced to Ru in the (N+1)th round of step S1, and is subsequently oxidized to $RuO_4$ in the (N+1)th round of step S2 and sublimated. It is possible to suppress the etching stop caused by the generation of $RuO_2$, and control an amount to be etched based on the target number of cycles. The etched amount is increased as the target number of cycles increases.

Since the cycle is repeated multiple times, the oxidation of ruthenium is temporarily stopped before the unevenness of etching becomes apparent, and the reduction of ruthenium oxide is performed before the oxidation of ruthenium is resumed. Since the oxidation number of ruthenium can be initialized to zero, it is possible to suppress appearance of unevenness in etching and to reduce the height difference of surface irregularities. Specifically, the surface roughness of the ruthenium film 13 can be suppressed to the extent that almost no height difference of surface irregularities is recognizable in a direction orthogonal to the width direction and the depth direction of the recesses 14 (the direction orthogonal to the paper in FIG. 4).

In addition, in the above-mentioned Patent Document 1, the supply of the hydrogen-containing gas (step S1) and the supply of the oxygen-containing gas (step S2) are performed simultaneously. In this case, the hydrogen-containing gas and the oxygen-containing gas react with each other to generate active oxidizing species (for example, OH) having strong oxidizing power. As a result, the generation of $RuO_2$ is promoted, and the unevenness of etching becomes apparent.

In the substrate processing method of the present embodiment, the reduction of the substrate surface and the oxidation and etching of the substrate surface are repeated so as to advance the etching. The technique of repeating etching on a unit of atomic layer as in this embodiment is generally called an atomic layer etching (ALE).

In step S3 of FIG. 3, the number of executed cycles is checked. When the number of cycles is smaller than the target number (step S3, NO), it is determined that the etched amount of the ruthenium film 13 is smaller than the target amount. Therefore, steps S1 and S2 of FIG. 3 are repeated. On the other hand, when the number of cycles reaches the target number (step S3, YES), it is determined that the etched amount of the ruthenium film 13 reaches the target amount. Thus, the current process is terminated. The target number may be determined in advance by experiment or the like.

Although step S2 is performed after step S1 in FIG. 3, the order of step S1 and step S2 may be reversed. That is, step S1 may be performed after step S2. The order is not limited because the cycle including step S1 and step S2 is repeated multiple times.

Figure 5:
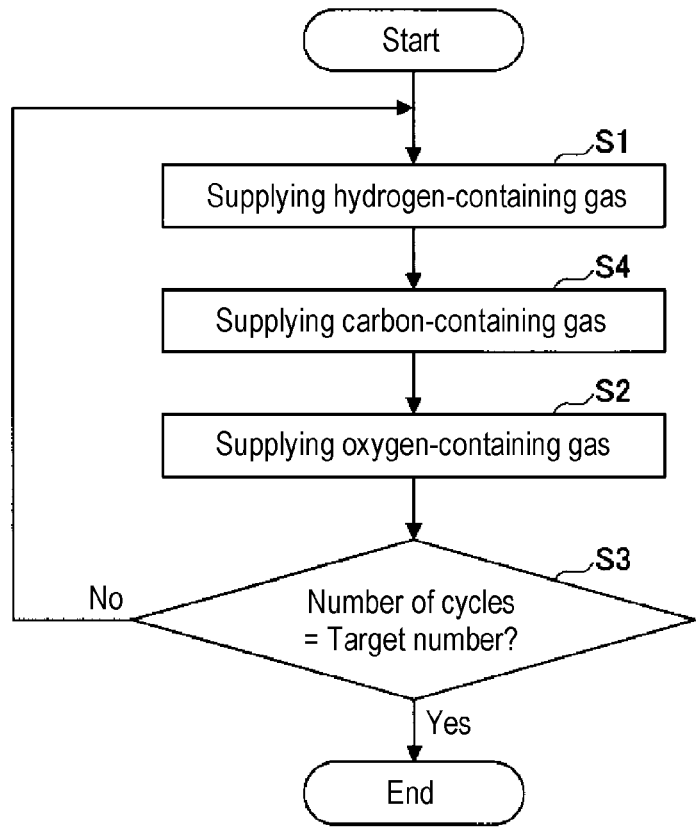
FIG. 5 is a flowchart illustrating a substrate processing method according to a modification of FIG. 3.
Figure 6:
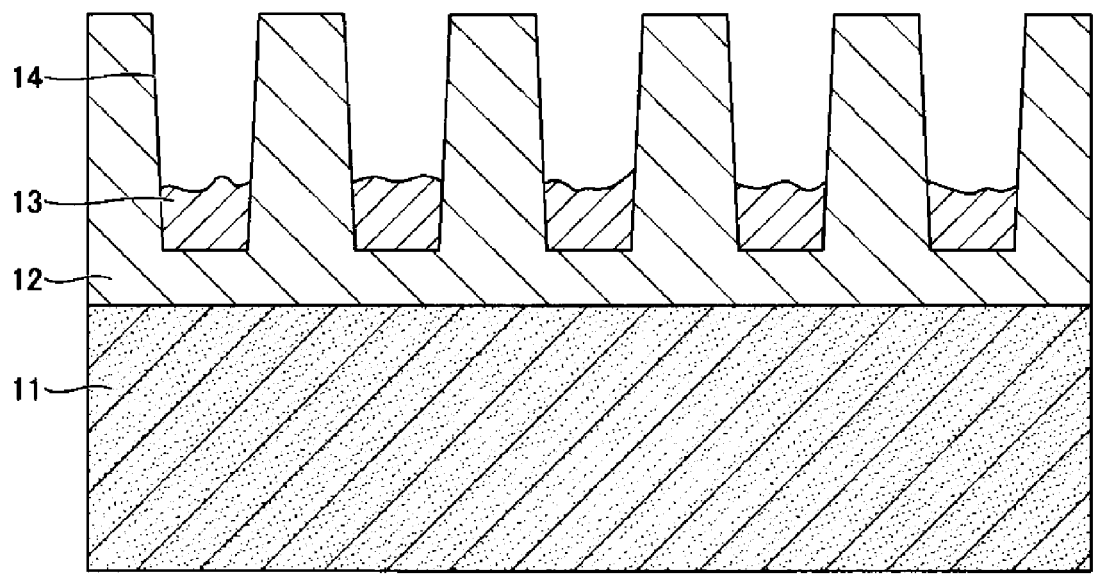
FIG. 6 is a cross-sectional view illustrating an example of a substrate after being processed by the substrate processing method of FIG. 5.

Next, a substrate processing method according to a modification will be described with reference to FIGS. 5 and 6. Hereinafter, differences from the above embodiment will be mainly described. As illustrated in FIG. 5, a cycle of the present modification further includes supplying a carbon-containing gas (step S4) in addition to supplying the hydrogen-containing gas (step S1) and supplying the oxygen-containing gas (step S2).

In step S4 of FIG. 5, a carbon-containing gas is supplied to the substrate 10 so that the carbon-containing gas reacts with the surface of the ruthenium film 13. Carbon atoms are adsorbed onto the surface. The adsorbed carbon atoms consume the oxygen atoms supplied in subsequent step S2 to alleviate the oxidation of Ru. In other words, the generation of $RuO_2$ having a low vapor pressure is suppressed locally. As a result, the entire surface of the ruthenium film 13 can be uniformly etched, which makes it possible to suppress generation of needle-shaped crystals 15 illustrated in FIG. 4.

The carbon-containing gas contains at least one selected from a group consisting of a hydrocarbon gas and an alcohol gas. The hydrocarbon gas is represented by the general formula "$C_XH_Y$". Each of X and Y is an integer of 1 or more. The hydrocarbon gas may or may not have an unsaturated bond. The unsaturated bond may be a double bond or a triple bond. The hydrocarbon gas may be plasmarized, but in this modification, the hydrocarbon gas may not be plasmarized but may be activated by heat. The carbon-containing gas is not particularly limited as long as it can alleviate the oxidation of Ru.

The order of steps S1, S2, and S4 is not limited to the order illustrated in FIG. 5. Step S4 is performed between step S1 and step S2 in FIG. 5, but may be performed before step S1 and step S2 or after step S1 and step S2. The order is not limited because the cycle including steps S1, S2, and S4 is repeated.

Next, a substrate processing apparatus 100 for carrying out the substrate processing method of FIG. 3 or 5 will be described with reference to FIGS. 7A and 7B. The substrate processing apparatus 100 is a batch-type vertical heat treatment apparatus that collectively performs heat treatment on plural sheets of substrates.

The substrate processing apparatus 100 includes a processing container 110, a substrate holder 120, a heater 130, a gas supply part 140, a gas discharge part 150, and a controller 160. The processing container 110 accommodates substrates 10. The substrate holder 120 holds the substrates 10 inside the processing container 110. The heater 130 heats the substrates 10 held by the substrate holder 120. The gas supply part 140 supplies gas into the processing container 110. The gas discharge part 150 exhausts the gas from the interior of the processing container 110. The controller 160 controls the heater 130, the gas supply part 140, and the gas discharge part 150 so as to perform the substrate processing method illustrated in FIG. 3 or 5.

The processing container 110 has a cylindrical processing container body 111. The processing container body 111 is formed of, for example, quartz. The processing container body 111 is arranged vertically, and has a ceiling at an upper end thereof and an opening in a lower end thereof. A flange 112 is formed at the lower end of the processing container body 111.

The processing container 110 further includes a cylindrical manifold 114 provided below the processing container body 111. The manifold 114 is made of, for example, stainless steel. A flange 115 is formed on an upper end of the manifold 114. The flange 112 of the processing container body 111 is installed on the flange 115. A seal member such as an O-ring is disposed between the flange 115 and the flange 112.

The processing container 110 further includes a lid 118. The lid 118 closes an opening portion formed in the lower end of the manifold 114. A seal member such as an O-ring is disposed between the lid 118 and the lower end of the manifold 114. The lid 118 is formed of, for example, stainless steel. A through-hole that penetrates the lid 118 in the vertical direction is formed in the central portion of the lid 118. A rotary shaft 171 is disposed in the through-hole. A gap between the lid 118 and the rotary shaft 171 is sealed by a magnetic fluid seal 172. A lower end portion of the rotary shaft 171 is rotatably supported by an arm 182 of a lifter 181. A rotary plate 173 is provided at an upper end portion of the rotary shaft 171. The substrate holder 120 is installed on the rotary plate 173 via a heat-insulating table 121.

The substrate holder 120 holds the plurality of substrates 10 at intervals in the vertical direction. Each of the plurality of substrates 10 is held in a horizontal posture. When the lifter 181 is raised, the lid 118 and the substrate holder 120 are raised, the substrate holder 120 is loaded into the processing container 110, and the lower end opening of the processing container 110 is hermetically closed by the lid 118. When the lifter 181 is lowered, the lid 118 and the substrate holder 120 are lowered, and the substrate holder 120 is unloaded to the outside of the processing container 110. Further, when the rotary shaft 171 is rotated, the substrate holder 120 is rotated together with the rotary plate 173. The substrate holder 120 is formed of, for example, quartz or silicon carbide.

The heater 130 heats the substrates 10 held by the substrate holder 120. The heater 130 is formed in a cylindrical shape outside the processing container 110. The heater 130 is, for example, an electric heater.

The gas supply part 140 supplies gases into the processing container 110. The gas supply part 140 supplies the gases used in the substrate processing method of FIG. 3 or FIG. 5 to the interior of the processing container 110. For example, the gas supply part 140 supplies the hydrogen-containing gas, the oxygen-containing gas, and the carbon-containing gas into the processing container 110.

Figure 7A:
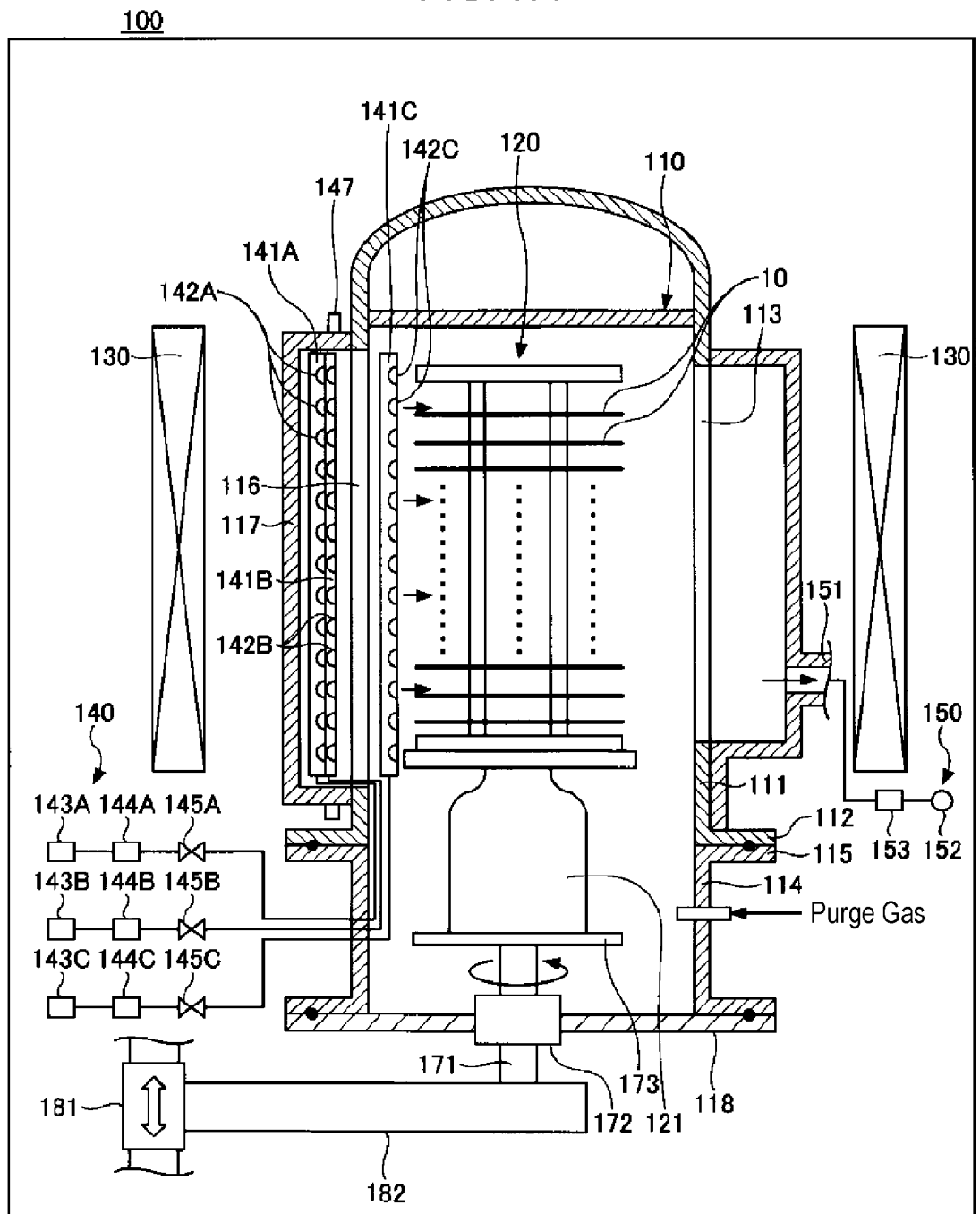
FIG. 7A is a vertical sectional view of a substrate processing apparatus for performing the substrate processing method of FIG. 3 or FIG. 5.
Figure 7B:
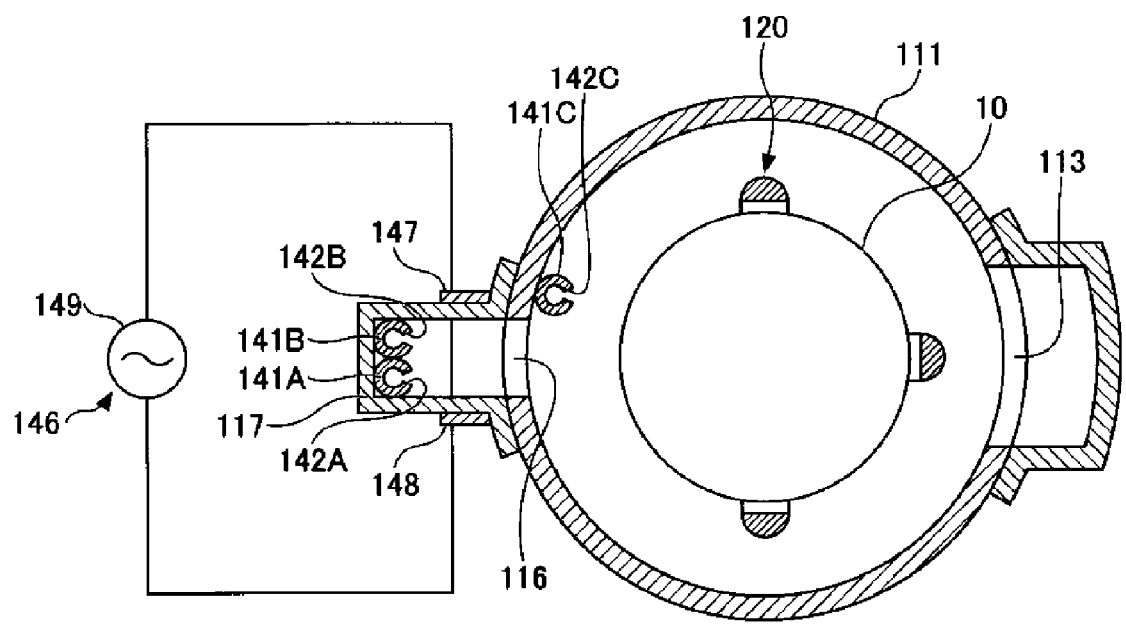
FIG. 7B is a horizontal cross-sectional view of a portion of the substrate processing apparatus of FIG. 7A.

As illustrated in FIG. 7B, the gas supply part 140 has gas supply pipes 141A, 141B, and 141C vertically provided inside the processing container 110. The gas supply pipe 141A is for the hydrogen-containing gas, the gas supply pipe 141B is for the oxygen-containing gas, and the gas supply pipe 141C is for the carbon-containing gas.

The gas supply pipes 141A, 141B, and 141C have a plurality of air supply ports 142A, 142B, and 142C, respectively, which are vertically spaced apart from each other. The plurality of air supply ports 142A, 142B, and 142C eject the gases horizontally.

A single gas supply pipe may sequentially eject multiple types of gases. In addition, a plurality of gas supply pipes may eject the same type of gases simultaneously.

The gas supply part 140 has gas sources 143A, 143B, and 143C. The gas sources 143A, 143B, and 143C supply the gases to the gas supply pipes 141A, 141B, and 141C via flow rate controllers 144A, 144B, and 144C and opening/closing valves 145A, 145B, and 145C, respectively. The flow rate controllers 144A, 144B, and 144C control flow rates of respective gases. The opening/closing valves 145A, 145B, and 145C switch between supply and interruption of respective gases.

As illustrated in FIG. 7B, an opening portion 116 is formed in a portion of the processing container body 111 in the circumferential direction. An accommodation portion 117 is provided so as to close the opening portion 116. The accommodation portion 117 is formed so as to protrude radially outward of the processing container body 111, and has, for example, a U-shape when viewed in the vertical direction.

The accommodation portion 117 accommodates the gas supply pipes 141A and 141B. The gas supply pipes 141A and 141B horizontally eject gases toward the opening portion 116 so that the gases are supplied into the processing container body 111 through the opening portion 116. The gas supply pipe 141C is disposed outside the accommodation portion 117 and inside the processing container body 111.

As illustrated in FIG. 7B, the substrate processing apparatus 100 may further include a plasma generator 146. The plasma generator 146 converts the gases supplied by the gas supply part 140 into plasma. The controller 160 also controls the plasma generator 146.

For example, the plasma generator 146 plasmarizes the gases in an internal space of the accommodation portion 117. The plasma generator 146 includes a pair of electrodes 147 and 148 arranged so as to sandwich the accommodation portion 117 therebetween, and a high-frequency power supply 149 which applies a high-frequency voltage between the pair of electrodes 147 and 148. The pair of electrodes 147 and 148 are provided in a vertically elongated shape, similarly to the gas supply pipes 141A and 141B.

By applying the high-frequency voltage between the pair of electrodes 147 and 148, a high-frequency electric field is applied to the internal space of the accommodation portion 117 so that the gases are plasmarized in the internal space of the accommodation portion 117. For example, the hydrogen-containing gas is plasmarized to generate H radicals. Further, the oxygen-containing gas is plasmarized to generate O radicals. The H radicals and the O radicals are supplied to the interior of the processing container body 111 through the opening portion 116.

The gas discharge part 150 exhausts the gases from the interior of the processing container body 111. An exhaust port 113 is formed in the processing container body 111. The exhaust port 113 is disposed to face the air supply ports 142A, 142B, and 142C. The gases horizontally ejected from the air supply ports 142A, 142B, and 142C pass through the exhaust port 113 and are then exhausted from an exhaust pipe 151. The gas discharge part 150 has the exhaust pipe 151, a vacuum pump 152, and a pressure controller 153. The exhaust pipe 151 connects the exhaust port of the processing container body 111 and the vacuum pump 152. The vacuum pump 152 suctions the gases from the interior of the processing container body 111. The pressure controller 153 is provided in the exhaust pipe 151 to control an internal atmospheric pressure of the processing container body 111.

The controller 160 is, for example, a computer, and includes a central processing unit (CPU) 161 and a storage medium 162 such as a memory. The storage medium 162 stores a program for controlling various kinds of processing to be executed in the substrate processing apparatus 100. The controller 160 controls the operation of the substrate processing apparatus 100 by causing the CPU 161 to execute the program stored in the storage medium 162.

The substrate processing apparatus 100 is not limited to the vertical heat treatment apparatus illustrated in FIGS. 7A and 7B. As an example, the substrate processing apparatus 100 may be a single-wafer type processing apparatus that processes the substrates 10 one by one. In addition, the substrate processing apparatus 100 may be a semi-batch type apparatus. The semi-batch type apparatus rotates the plurality of substrates 10 arranged around the rotational central line of a rotary table together with the rotary table such that the substrates 10 sequentially pass through a plurality of areas to which different gases are supplied.

Reference Example and Examples

Table 1 shows processing conditions used in Reference Example and Examples 1 to 4.

TABLE 1

| | | Reference example | Example 1 | Example 2 | Example 3 | Example 4 |
|---|---|---|---|---|---|---|
| Hydrogen-containing gas | Gas type | $H_2$-RF | $H_2$-RF | $H_2$-RF | $H_2$-RF | $H_2$-RF |
| | Time(sec) | 30 | 30 | 30 | 30 | 30 |
| Carbon-containing gas | Gas type | — | — | $C_4H_6$ | — | $C_4H_6$ |
| | Time(sec) | — | — | 30 | — | 30 |
| Oxygen-containing gas | Gas type | $O_2$-RF | $O_2$-RF | $O_2$-RF | $O_2$-RF | $O_2$-RF |
| | Time(sec) | 900 | 30 | 30 | 30 | 30 |
| Cycle number | | 1 | 30 | 30 | 60 | 60 |
| Substrate temperature (° C.) | | 200 | 200 | 200 | 200 | 200 |

In Table 1, "RF" means that the gas was plasmarized.

Figure 8A:
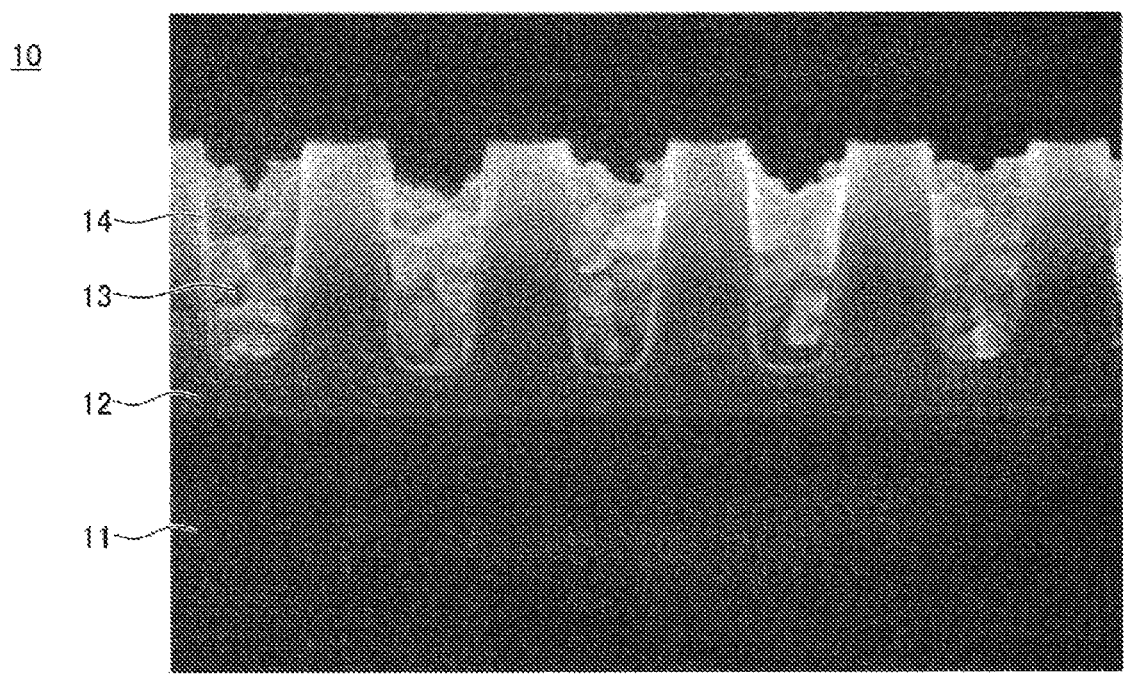
FIG. 8A is an SEM photograph of a substrate obtained by a substrate processing method of Reference Example.

In Reference Example, the substrate processing method illustrated in FIG. 1 was performed using the substrate processing apparatus 100 illustrated in FIGS. 7A and 7B. A $H_2$ gas, which is the hydrogen-containing gas, was supplied for 30 seconds while being plasmarized. An $O_2$ gas, which is the oxide-containing gas, was supplied for 900 seconds while being plasmarized. The temperature of the substrate 10 was 200 degrees C. FIG. 8A shows an SEM photograph of the substrate 10 obtained by performing the substrate processing method in Reference Example.

As is apparent from FIG. 8A, according to Reference Example, the etched amount was small Since the supply of the hydrogen-containing gas (step S1) and the supply of the oxygen-containing gas (step S2) were performed once, it is considered that the progress of etching stopped from the time at which $RuO_2$ was generated.

Further, as is apparent from FIG. 8A, according to Reference Example, the surface of the ruthenium film 13 was rough, and the height difference of surface irregularities was large. The height difference was apparent not only in the width direction of the recesses 14 (the left-right direction on the paper in FIG. 8A), but also in the direction orthogonal to the width direction and the depth direction of the recesses 14 (the direction orthogonal to the paper in FIG. 8B).

In Example 1, the substrate processing method illustrated in FIG. 3 was performed using the substrate processing apparatus 100 illustrated in FIGS. 7A and 7B. A $H_2$ gas, which is the hydrogen-containing gas, was supplied for 30 seconds per cycle while being plasmarized. An $O_2$ gas, which is the oxide-containing gas, was supplied for 30 seconds per cycle while being plasmarized. The cycle was repeated 30 times. The processing temperature of the substrate 10 was 200 degrees C. An SEM photograph of the substrate 10 obtained by performing the substrate processing method of Example 1 is illustrated in FIG. 8B.

Figure 8B:
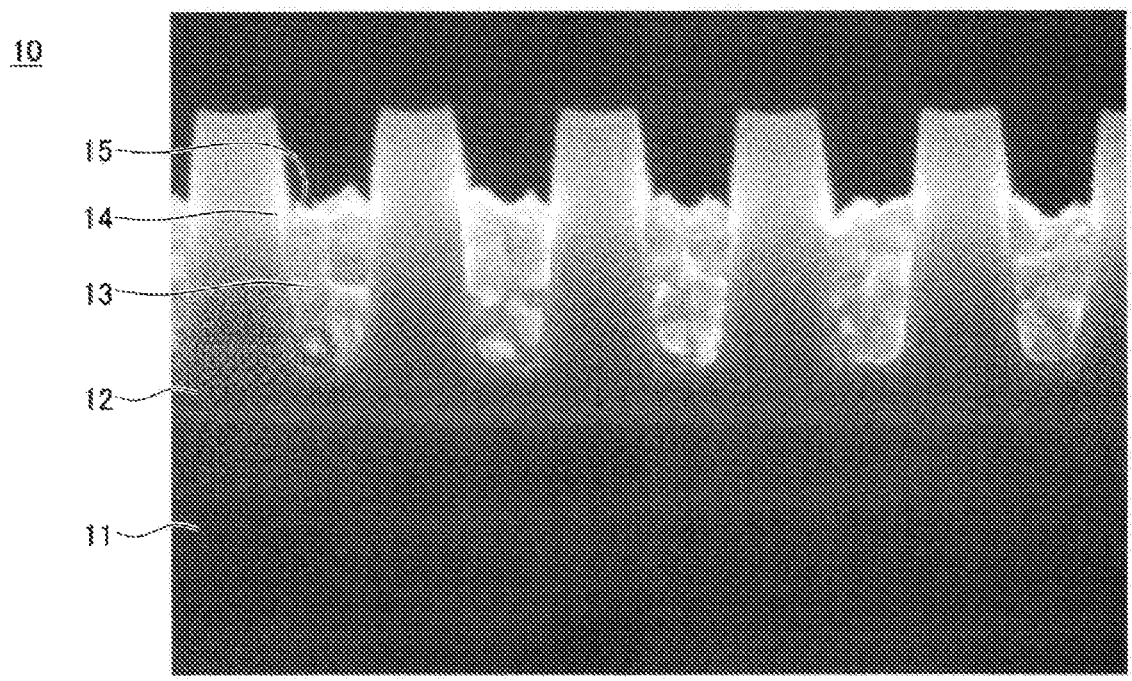
FIG. 8B is an SEM photograph of a substrate obtained by a substrate processing method of Example 1.

As is apparent from FIG. 8B, according to Example 1, unlike Reference Example, the cycle was repeated multiple times, and thus stopping of the etching was prevented. It is considered that this is because even if $RuO_2$ is generated once, $RuO_2$ is changed back to the original Ru, Ru is further oxidized to $RuO_4$, and $RuO_4$ is sublimated, so that etching continues to proceed.

Further, as is apparent from FIG. 8B, according to Example 1, unlike Reference Example, since the cycle was repeated multiple times, it was possible to reduce the height difference of the surface irregularities of the ruthenium film 13. In particular, in the direction orthogonal to the width direction and the depth direction of the recesses 14 (the direction orthogonal to the paper in FIG. 8B), almost no height difference of surface irregularities was recognized. It is presumed that the effect of a polycrystalline film can be reduced by repeating the cycle.

In Example 2, the substrates 10 were processed in the same manner as in Example 1 except that the carbon-containing gas was supplied (step S4) between the supply of the hydrogen-containing gas (step S1) and the supply of the oxygen-containing gas (step S2). That is, in Example 2, the substrate processing method illustrated in FIG. 5 was performed using the substrate processing apparatus 100 illustrated in FIGS. 7A and 7B. A $C_4H_6$ gas, which is the carbon-containing gas, was activated by heat without being plasmarized, and was supplied for 30 seconds per cycle. An SEM photograph of the substrate 10 obtained by performing the substrate processing method of Example 2 is illustrated in FIG. 8C.

Figure 8C:
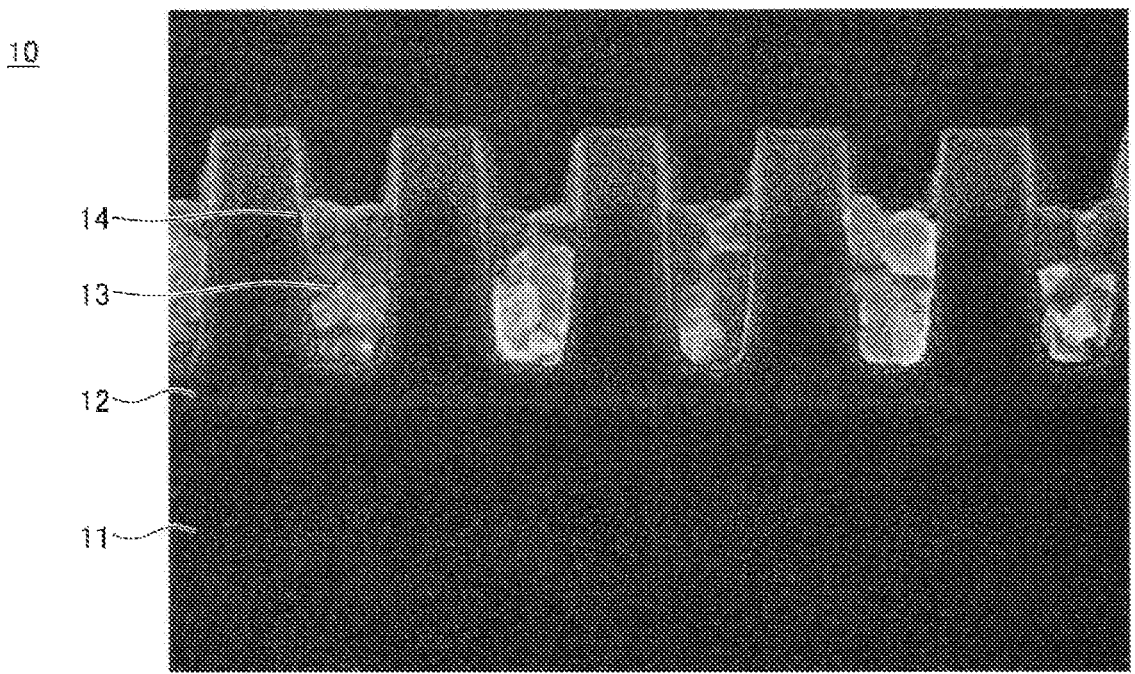
FIG. 8C is an SEM photograph of a substrate obtained by a substrate processing method of Example 2.

As is apparent from FIG. 8C, according to Example 2, unlike Example 1, it was possible to suppress the generation of the needle-shaped crystals 15 since the carbon-containing gas was supplied. Carbon atoms are adsorbed onto the surface of the ruthenium film 13. The adsorbed carbon atoms consume the oxygen atoms supplied in step S2 to alleviate the oxidation of Ru. That is, it is presumed that the generation of $RuO_2$ having a low vapor pressure is locally suppressed.

In Example 3, the substrates 10 were processed in the same manner as in Example 1 except that the target number of cycles was increased from 30 to 60. An SEM photograph of the substrate 10 obtained by performing the substrate processing method in Example 3 is illustrated in FIG. 8D.

Figure 8D:
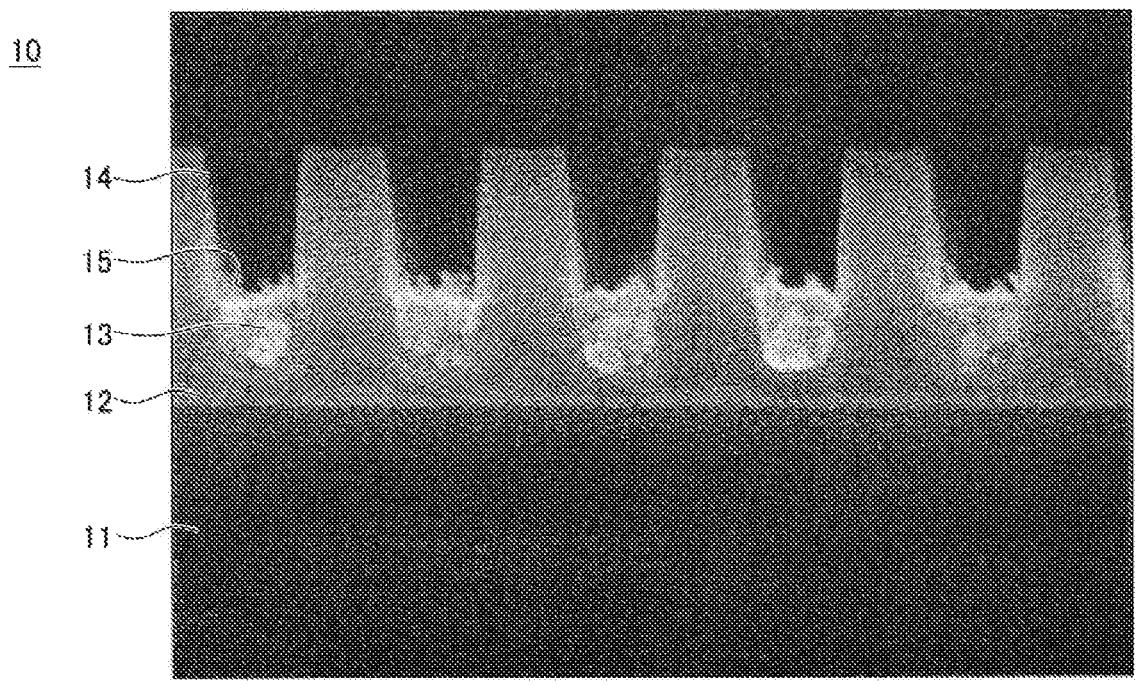
FIG. 8D is an SEM photograph of a substrate obtained by a substrate processing method of Example 3.

As is apparent from FIG. 8D, according to Example 3, it was possible to increase the etched amount since the target number of cycles was increased compared with Example 1. Accordingly, it was found that the etched amount can be controlled based on the target number of cycles.

In Example 4, the substrates 10 were processed in the same manner as in Example 3, except that the carbon-containing gas was supplied (step S4) between the supply of the hydrogen-containing gas (step S1) and the supply of the oxygen-containing gas (step S2). In other words, in Example 4, the substrates 10 were processed in the same manner as in Example 2 except that the target number of cycles was increased from 30 to 60. An SEM photograph of the substrate 10 obtained by performing the substrate processing method in Example 4 is illustrated in FIG. 8E.

Figure 8E:
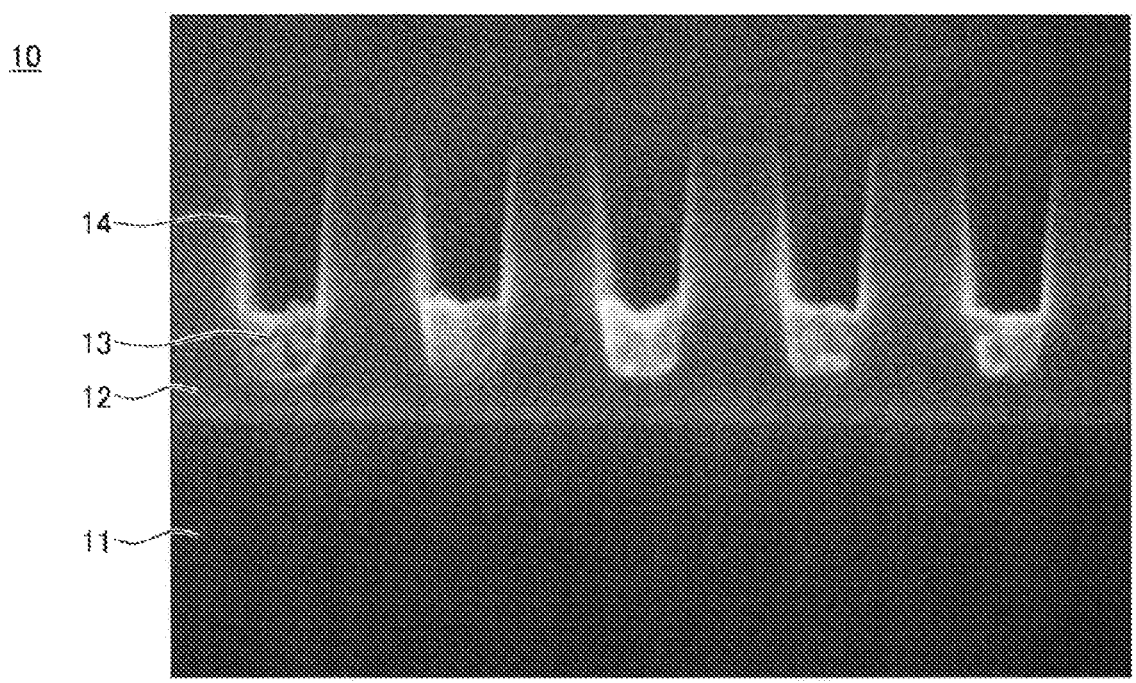
FIG. 8E is an SEM photograph of a substrate obtained by a substrate processing method of Example 4.

As is apparent from FIG. 8E, according to Example 4, it was possible to increase the etched amount since the target number of cycles was increased compared with Example 2. Accordingly, it was found that the etched amount can be controlled based on the target number of cycles.

In addition, as is apparent from FIG. 8E, according to Example 4, unlike Example 3, it was possible to suppress the generation of the needle-shaped crystals 15 since the carbon-containing gas was supplied. Carbon atoms are adsorbed onto the surface of the ruthenium film. The adsorbed carbon atoms consume the oxygen atoms supplied in step S2 to alleviate the oxidation of Ru. That is, it is presumed that the generation of $RuO_2$ having a low vapor pressure is locally suppressed.

In Reference Example and Examples 1 to 4 shown in Table 1 above, the processing temperature of the substrates 10 was 200 degrees C. On the other hand, in Example 5, the substrates 10 were processed in the same manner as in Example 3 except that the processing temperature of the substrates 10 was increased from 200 degrees C. to 300 degrees C. As a result, volume expansion of the ruthenium film 13 was apparent. It is considered that this volume expansion was caused due to the oxidation of the ruthenium film 13.

On the other hand, in Example 6, the substrates 10 were processed in the same manner as in Example 5 except that the carbon-containing gas was supplied (step S4) between the supply of the hydrogen-containing gas (step S1) and the supply of the oxygen-containing gas (step S2). As a result, the effect of suppressing the volume expansion of the ruthenium film was recognized. This is presumed to be because carbon atoms are adsorbed onto the surface of the ruthenium film 13 in step S4 and the adsorbed carbon atoms consume the oxygen atoms supplied in step S2 to alleviate the oxidation of Ru. That is, it is presumed that the generation of $RuO_2$ having a low vapor pressure is suppressed.

According to an aspect of the present disclosure, it is possible to prevent etching from being stopped by the formation of $RuO_2$, and to suppress the surface roughness of a ruthenium film due to the etching.

Although the embodiments of the substrate processing method and the substrate processing apparatus according to the present disclosure have been described above, the present disclosure is not limited to the above-described embodiments. Various changes, modifications, substitutions, additions, deletions, and combinations can be made within the scope of the claims. Of course, these also belong to the technical scope of the present disclosure.

For example, a method of plasmarizing a gas into is not limited to the method of applying the high-frequency electric field to the internal space of the accommodation portion 117. For example, other inductively coupled plasma and microwave plasma may also be used.

What is claimed is:
1. A substrate processing method comprising:
repeating, multiple times, a cycle including:
reducing an oxide of a ruthenium film by supplying a hydrogen-containing gas to a substrate including the ruthenium film;
etching the ruthenium film by supplying an oxygen-containing gas to the substrate so as to oxidize the ruthenium film; and stopping the etching of the ruthenium film,
wherein the reducing the oxide of the ruthenium film is performed when the etching of the ruthenium film is stopped,
wherein the hydrogen-containing gas is at least one selected from a group consisting of a $H_2$ gas, a $NH_3$ gas, a hydrazine gas, and a hydrazine compound gas; and
wherein the oxygen-containing gas is at least one selected from a group consisting of an $O_2$ gas and an $O_3$ gas.

2. The substrate processing method of claim 1, wherein the hydrogen- containing gas is a plasmarized gas.

3. The substrate processing method of claim 1, wherein the oxygen-containing gas is a plasmarized gas.

4. The substrate processing method of claim 1, wherein the cycle further includes supplying a carbon-containing gas to the substrate so that the carbon-containing gas reacts with a surface of the ruthenium film.

5. The substrate processing method of claim 4, wherein the carbon-containing gas includes at least one selected from a group consisting of a hydrocarbon gas and an alcohol gas.

6. The substrate processing method of claim 1, wherein the substrate includes an insulation film and the ruthenium film buried in a recess of the insulation film.

* * * * *